United States Patent
Chen et al.

(10) Patent No.: US 11,469,345 B2
(45) Date of Patent: Oct. 11, 2022

(54) VERTICAL LIGHT EMITTING DIODE STRUCTURE WITH HIGH CURRENT DISPERSION AND HIGH RELIABILITY

(71) Applicant: EXCELLENCE OPTO. INC., Miaoli County (TW)

(72) Inventors: Fu-Bang Chen, Miaoli County (TW); Kuo-Hsin Huang, Miaoli County (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 84 days.

(21) Appl. No.: 17/154,021

(22) Filed: Jan. 21, 2021

(65) Prior Publication Data
US 2022/0231190 A1     Jul. 21, 2022

(51) Int. Cl.
| | |
|---|---|
| H01L 33/04 | (2010.01) |
| H01L 33/38 | (2010.01) |
| H01L 33/62 | (2010.01) |
| H01L 33/40 | (2010.01) |
| H01L 33/12 | (2010.01) |
| H01L 33/46 | (2010.01) |

(52) U.S. Cl.
CPC ............ H01L 33/04 (2013.01); H01L 33/12 (2013.01); H01L 33/38 (2013.01); H01L 33/405 (2013.01); H01L 33/46 (2013.01); H01L 33/62 (2013.01)

(58) Field of Classification Search
CPC ......... H01L 33/04; H01L 33/12; H01L 33/38; H01L 33/405; H01L 33/46; H01L 33/62
See application file for complete search history.

(56) References Cited

U.S. PATENT DOCUMENTS

| | | | |
|---|---|---|---|
| 8,319,250 B2 | 11/2012 | Rode et al. | |
| 2015/0034900 A1* | 2/2015 | Aihara | H01L 33/405 |
| | | | 257/13 |
| 2015/0280074 A1* | 10/2015 | Lee | H01L 33/44 |
| | | | 257/98 |
| 2018/0090539 A1* | 3/2018 | Son | H01L 33/06 |
| 2018/0145224 A1* | 5/2018 | Kim | H01L 33/0075 |
| 2019/0164945 A1* | 5/2019 | Chae | H01L 33/405 |

* cited by examiner

*Primary Examiner* — Mark W Tornow
(74) *Attorney, Agent, or Firm* — Muncy, Geissler, Olds & Lowe, P.C.

(57) ABSTRACT

A vertical light emitting diode structure with high current dispersion and high reliability comprises a conductive substrate with a central region and a side region; a light emitting semiconductor layer is disposed on the central region; an ohmic contact metal layer is disposed at a center of the light emitting semiconductor layer; an N-type electrode is disposed at the side region and is connected with the ohmic contact metal layer and the N-type electrode through an N-type electrode bridging structure; a working current is diffused from the center of the light emitting semiconductor layer to have high current dispersion, so that the problem of heat dissipation of local high current caused by the design that the N-type electrode is disposed on the edge can be solved.

17 Claims, 9 Drawing Sheets

VERTICAL LIGHT EMITTING DIODE STRUCTURE WITH HIGH CURRENT DISPERSION AND HIGH RELIABILITY

FIELD OF THE INVENTION

The invention relates to a light emitting diode, in particular to a vertical light emitting diode structure with high current dispersion and high reliability.

BACKGROUND OF THE INVENTION

The vertical light emitting diode emits high-efficiency axial light, and is suitable for applications requiring high working current and high illuminance. The product can be applied to high-luminosity sterilization (ultraviolet light), vehicle headlights and taillights (blue, yellow and red light), projector light sources (blue, green and red_light), and infrared security detection (infrared light). Excellent high-power light emitting diode (LED) requires good reliability in addition to high luminance and light emission density. Taking the vehicle headlight module as an example, once the LED fails, it will affect the safety at night. With the high standard specification of automotive LEDs, even regarding 1 ppm of trace failure, an improvement is necessary in the automotive industry.

The wafer size adopted by the traditional high-power vertical light emitting diode is about 1 mm×1 mm, the working current of the same is 1A or higher, and the common structural design thereof includes the following characteristics: an electrode pad is positioned above the light emitting semiconductor layer so as to provide wiring, and the electrode pad usually adopts a thicker gold wire so as to facilitate large current passing. A finger-shaped auxiliary line is disposed above the light emitting semiconductor layer. The more auxiliary lines are disposed on the light emitting semiconductor layer, the better the current dispersion is, but the shading area is increased. The connecting material of the P-type electrode and the package adopts Au—Sn alloy for good conduction and heat dissipation, and a bottom of the connecting material has the requirements of high flatness and low porosity so as to reduce current collection and increase heat dissipation.

If the electrode pad is formed at a center of the light emitting semiconductor layer, optimal current dispersion is achieved, the light emitting efficiency is improved, better heat dissipation performance is achieved, and the local heating problem of current concentration is avoided. However, the thick gold wire used for packaging the electrode pads in the routing process would block light and interfere with light uniformity. To solve aforementioned problem, the electrode pad is usually disposed on the side edge of the light emitting semiconductor layer, but it causes light emission and heat generation to be concentrated on the side edge when the light emitting semiconductor layer works at high current, so that a good current dispersion effect of a centering design cannot be achieved.

At present, the failure types of the vertical light emitting diodes are roughly four types as follows. (1) Based on the arrangement of the electrode pad on the side edge, in case where the light emitting semiconductor layer works under a high working current, uneven light emission and electrode burning are caused due to poor diffusion and high heat at the edge. (2) Considering the wire bonding process is carried out on an electrode pad, which is on the surface of the light emitting semiconductor layer, the problem of damaging the light emitting semiconductor layer is caused, and the reliability is reduced. (3) If the packaging adhesive material is pulled, the light emitting semiconductor layer can be indirectly pulled through the gold wire on the electrode pad; accordingly micro cracks or thin film peelings are formed thereon, and the failure or instability of the package is caused. (4) If the connection between the P-type electrode and the package is not smooth or includes too many pores, local hot spots are formed under high working current, which further causes material deterioration and cause the device to burn out.

Thus, for example, U.S. Pat. No. 8,319,250 B2 provides a technique with a plurality of conductive pillars in which an N-type electrode is provided as the bottom electrode and a plurality of vertical conductive pillars insulated by side walls are extended through a P-type semiconductor layer, a multiple-quantum well layer, and into the N-type semiconductor layer so that the working current is uniformly dispersed into the N-type semiconductor layer, and the P-type electrode is provided with side edges for wiring of the packaging process. According to this design, the working current is optimally dispersed through the conductive pillars, and the wiring in the packaging process does not impact the light emitting semiconductor layer, so that the failure types of (1), (2), and (3) in the vertical light emitting diodes described above are improved. However, said structure comprises a large number of precise conductive pillars, of which the diameter is usually in a range from 20 μm to 30 μm, and the inner cylindrical wall is plated with an extremely thin insulating substance, where the central layer of the cylinder deposited with a highly conductive metal. Accordingly, the aforementioned structure is fine but fragile. Also, the manufacture process is complex, the cost is high, the manufacture process condition is narrow, and the failed product is not easy to detect. Further, the most serious problem is that if the external stress is too large (such as the deformation stress of the physical touching surface or in the packaging process), the conductive pillar would generates micro cracks to form a micro-conductive channel, so that the problem of immediate failure of the component or reduced long-term reliability is caused.

SUMMARY OF THE INVENTION

Therefore, the invention mainly aims to disclose a vertical light emitting diode structure with high current dispersion and high reliability so as to meet the use requirements of high axial property, high brightness and high reliability.

The invention discloses a vertical light emitting diode structure with high current dispersion and high reliability, including: a P-type electrode, a conductive substrate, a light emitting semiconductor layer, an ohmic contact metal layer, an N-type electrode bridging structure, and an N-type electrode. The conductive substrate is provided, on one side, with the P-type electrode, and, on the other side, with a central region and a side region adjacent to the central region. The light emitting semiconductor layer is disposed on the central region of the conductive substrate and includes a P-type semiconductor layer disposed on the conductive substrate, a multiple-quantum well layer (MQW) disposed on the P-type semiconductor layer and an N-type semiconductor layer disposed on the multiple-quantum well layer. The ohmic contact metal layer is disposed at a center of the N-type semiconductor layer and in ohmic contact with the N-type semiconductor layer. The N-type electrode bridging structure has a bridging insulating layer and a bridging conductive layer, the bridging insulating layer disposed to cross over the N-type semiconductor layer and the side region of the conductive substrate, the bridging insulating layer in contact with the ohmic contact metal layer, the bridging conductive layer disposed on the bridging insulating layer, one end of the bridging conductive layer being connected with the ohmic contact metal layer, and the other end of the bridging conductive layer extending to the side region of the conductive substrate. The N-type electrode is disposed on the bridging conductive layer and positioned above the side region.

Therefore, compared with the prior art, the present invention adopts a structural design of the vertical light emitting diode to have the advantages that it has high axial optical characteristics, the N-type electrode is disposed above the side region, the working current is guided to the center of the N-type semiconductor layer as a starting point for diffusion, high current dispersion is achieved, and the problems of interference by packaging gold wire caused by the centering of the N-type electrode and local high current caused by the edge design of the N-type electrode can be avoided. In addition, the light emitting semiconductor layer is not disposed below the N-type electrode, the light emitting semiconductor layer does not suffer from the problem of embrittlement caused by stress damage during a wire bonding process, and the risk of crack or separation of the light emitting semiconductor layer caused by wire bonding and pulling in a subsequent process is avoided, so that the reliability can be increased.

DETAILED DESCRIPTION OF THE PREFERRED EMBODIMENTS

Figure 1:
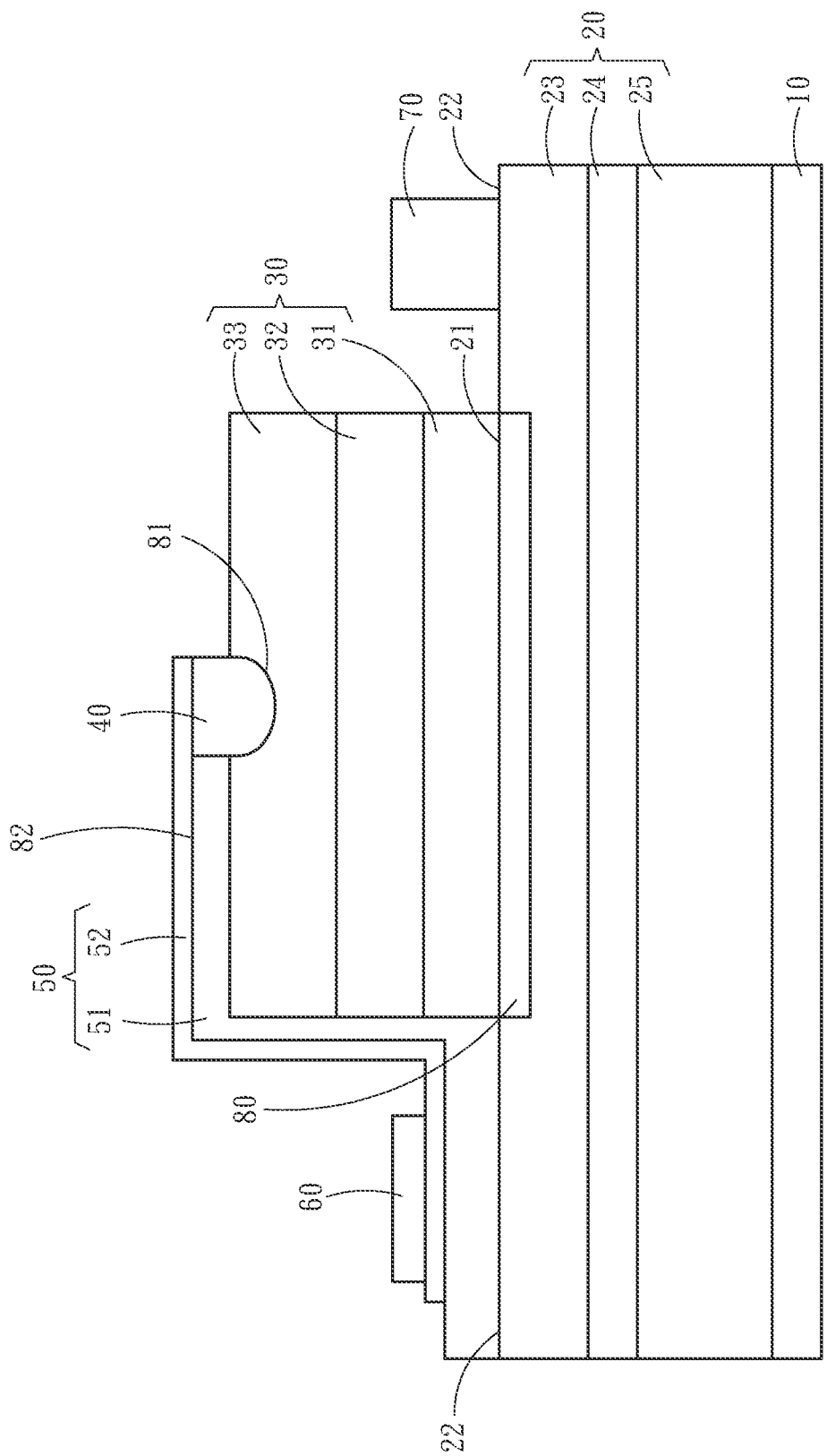
FIG. 1 is a schematic cross-sectional diagram of a structure of the present invention.
Figure 2:
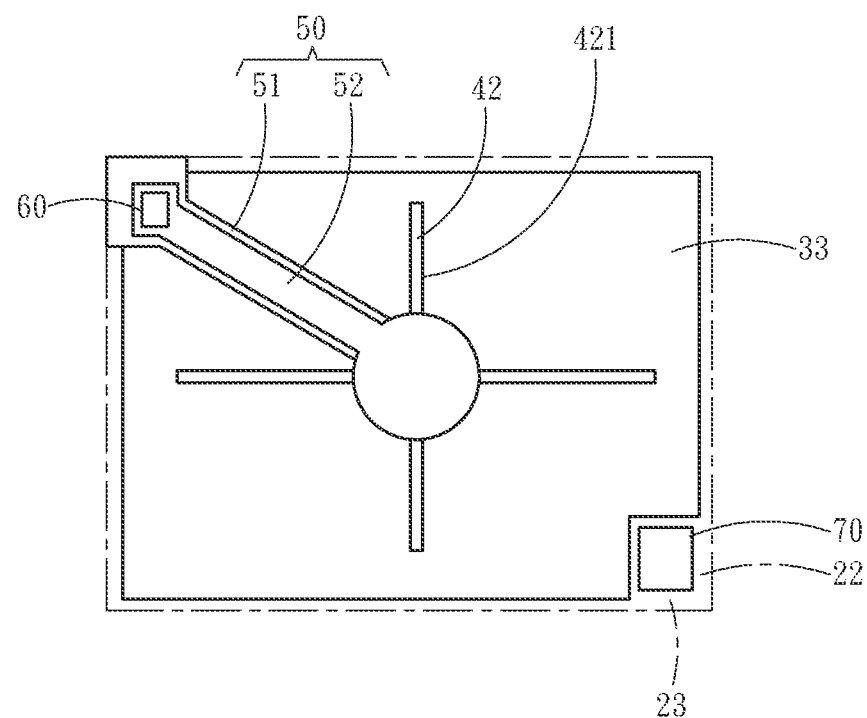
FIG. 2 is a schematic diagram of a top view of a structure of an embodiment of the present invention.

The detailed description and technical content of the present invention are now described in conjunction with the drawings as follows:

With reference to FIG. 1 and FIG. 2, the present invention provides a vertical light emitting diode structure with high current dispersion and high reliability. The vertical light emitting diode structure includes a P-type electrode 10, a conductive substrate 20, a light emitting semiconductor layer 30, an ohmic contact metal layer 40, an N-type electrode bridging structure 50, and an N-type electrode 60. One side of the conductive substrate 20 is provided with the P-type electrode 10, and the other side of the conductive substrate 20 is provided with a central region 21 and a side region 22 adjacent to the central region 21.

The light emitting semiconductor layer 30 is disposed on the central region 21 of the conductive substrate 20. The light emitting semiconductor layer 30 includes a P-type semiconductor layer 31, a multiple-quantum well (MQW) layer 32 and an N-type semiconductor layer 33. The P-type semiconductor layer 31 is disposed on the conductive substrate 20, the multiple-quantum well layer 32 is disposed on the P-type semiconductor layer 31, and the N-type semiconductor layer 33 is disposed on the multiple-quantum well layer 32.

The ohmic contact metal layer 40 is disposed at a center of the N-type semiconductor layer 33 and in ohmic contact with the N-type semiconductor layer 33. The N-type electrode bridging structure 50 includes a bridging insulating layer 51 and a bridging conductive layer 52. The bridging insulating layer 51 is disposed to cross over the N-type semiconductor layer 33 and the side region 22 of the conductive substrate 20. The bridging insulating layer 51 is in contact with the ohmic contact metal layer 40, and the bridging conductive layer 52 is disposed on the bridging insulating layer 51. One end of the bridging conductive layer 52 is connected with the ohmic contact metal layer 40, and the other end of the bridging conductive layer 52 extends to the side region 22 of the conductive substrate 20. The N-type electrode 60 is provided for a wire bonding process, and the N-type electrode 60 is disposed on the bridging conductive layer 52 and located above the side region 22.

In a preferred embodiment, the conductive substrate 20 includes a buffer layer 23, a bonding layer 24, and a substitute substrate 25. The bridging insulating layer 51 and the light emitting semiconductor layer 30 are disposed on the buffer layer 23, the P-type electrode 10 is disposed at the substitute substrate 25, and the bonding layer 24 bonds and fixes the buffer layer 23 and the substitute substrate 25.

Further, in one embodiment, the vertical light emitting diode structure includes an auxiliary P-type electrode 70 disposed on the side region 22 of the conductive substrate 20. The side region 22 surrounds the central region 21. The auxiliary P-type electrode 70 and the N-type electrode 60 are located on the side region 22 and respectively located on different sides of the central region 21, as shown in FIG. 2.

In another embodiment, the side region 22 also surrounds the central region 21. The auxiliary P-type electrode 70 and the N-type electrode 60 are located on the side region 22 and located on a same side of the central region 21, as shown in FIG. 3.

Figure 4:
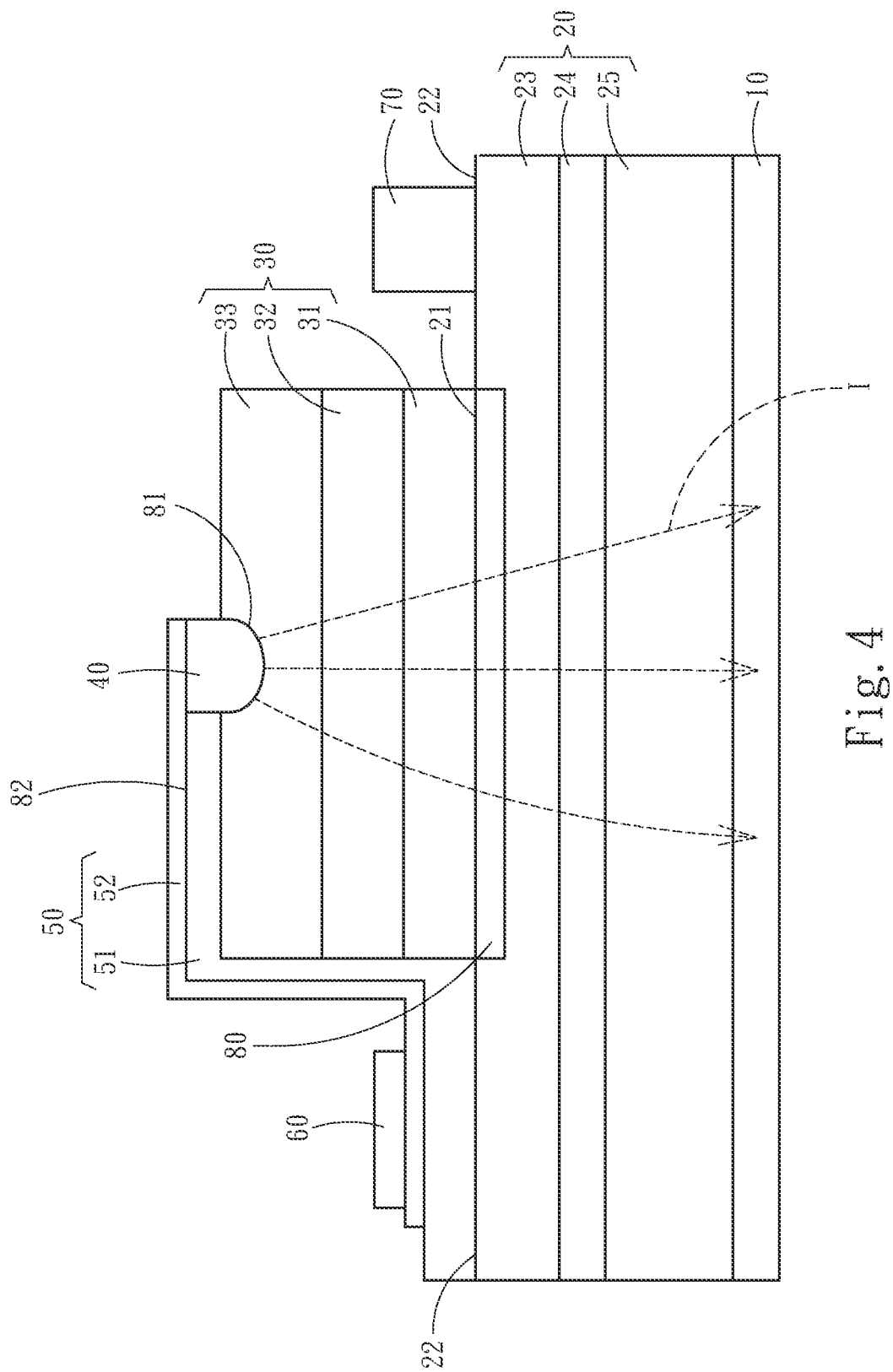
FIG. 4 is a schematic diagram of a circuit path adopted with medium and low currents.

With reference to FIG. 4, if the light emitting semiconductor layer 30 is driven to emit light, a working current I needs to be generated in the light emitting semiconductor layer 30. As the structure shown in FIG. 1, if the working current I is a low or medium current to drive the vertical light emitting diode for a low-brightness use, any one of the P-type electrode 10 and the auxiliary P-type electrode 70 is selected as a first electrode (shown in FIG. 4 is the selection of the P-type electrode 10), and the N-type electrode 60 is adopted as a second electrode. A working voltage is supplied between the first electrode and the second electrode (not shown in the figure). That is, the working current I is generated and enters the light emitting semiconductor layer 30 from the ohmic contact metal layer 40.

Figure 5:
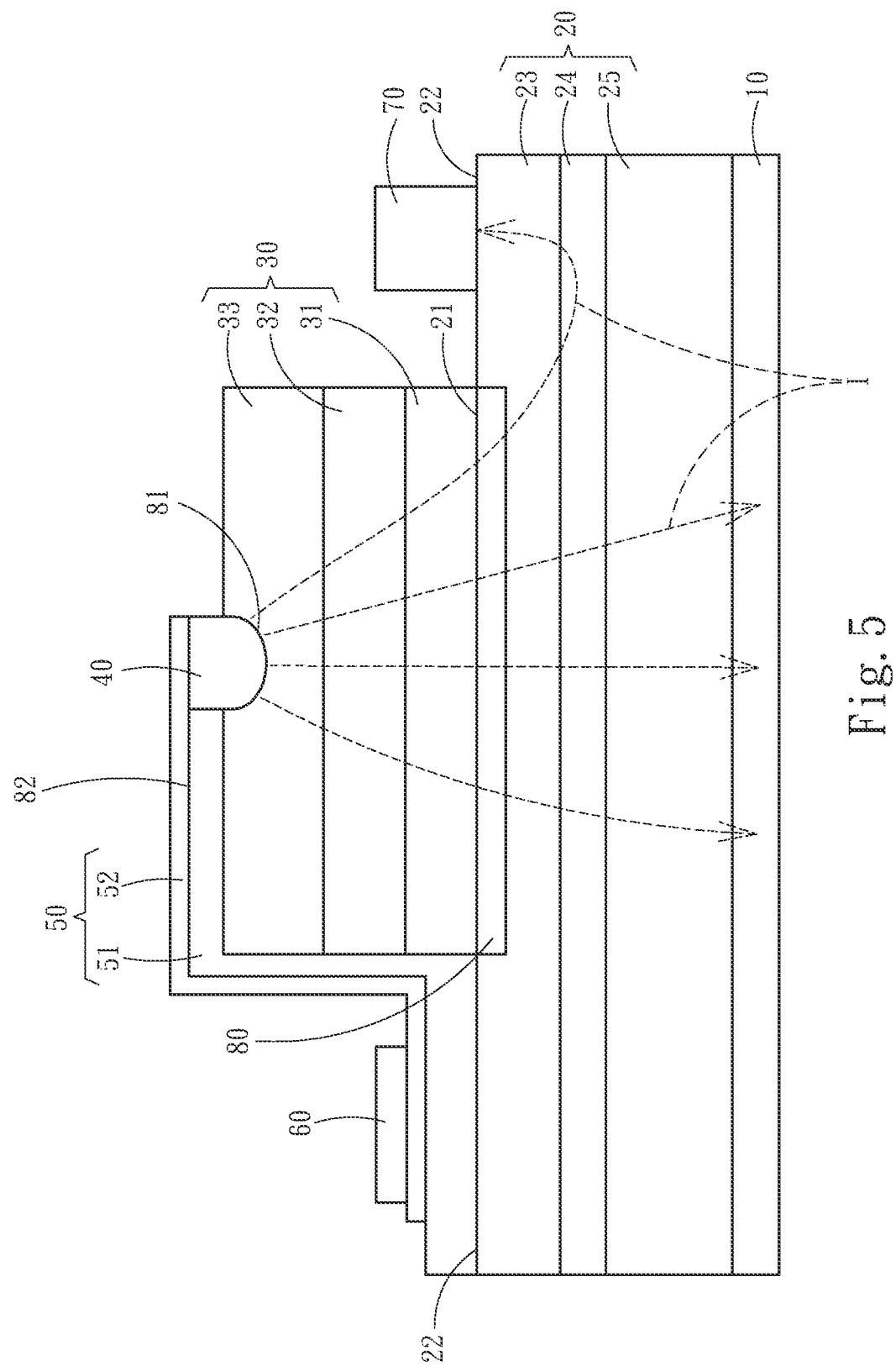
FIG. 5 is a schematic diagram of a circuit path adopted with high current.

With reference to FIG. 5, if the working current I is going to drive the vertical light emitting diode for a high-brightness use, both the P-type electrode 10 and the auxiliary P-type electrode 70 are adopted as the first electrode, and the N-type electrode 60 is adopted as the second electrode. A working voltage of a high voltage is supplied between the first electrode and the second electrode to generate the working current I with a large current. Since there are two paths for the large current of the working current I, the working current I is easily dispersed to reduce the current density thereof, avoiding the problem of the device early aging or even burning out due to local high temperature.

Figure 3:
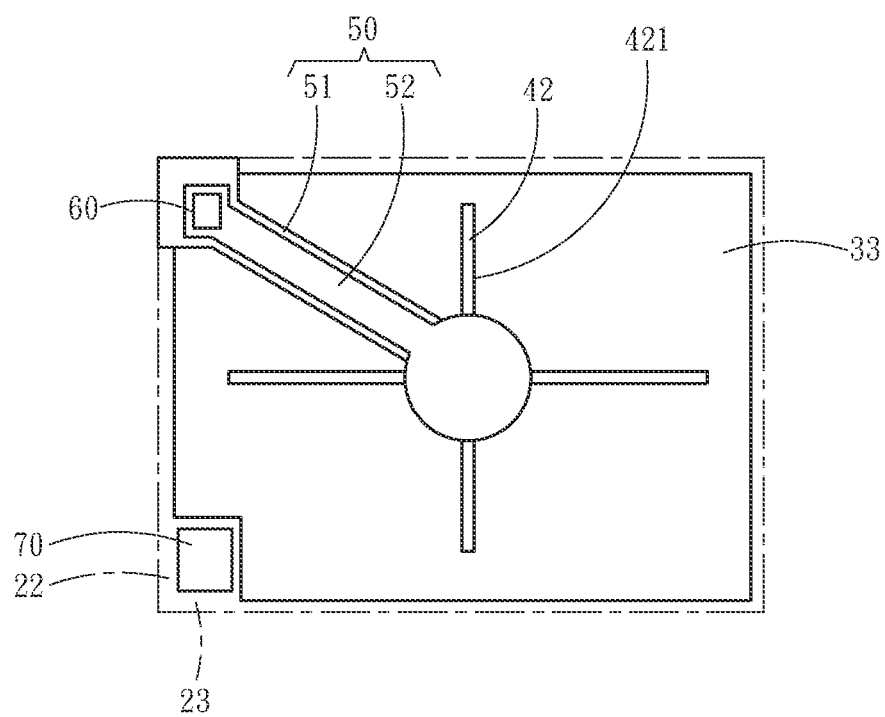
FIG. 3 is a schematic diagram of a top view of a structure of another embodiment of the present invention.
Figure 6:
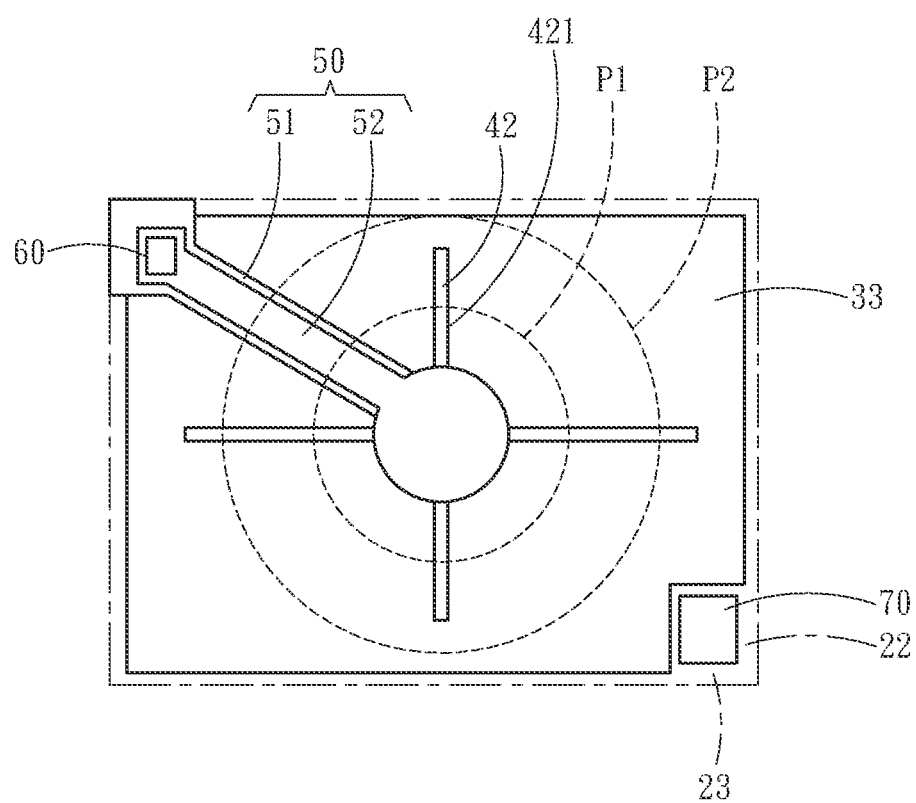
FIG. 6 is a schematic diagram of current density contour lines of the present invention.

With reference to FIG. 2 or FIG. 3, in order to further disperse the current and make the current evenly pass through the light emitting semiconductor layer 30, the vertical light emitting diode structure further includes at least one auxiliary conductive circuit 42. The at least one auxiliary conductive circuit 42 is disposed on the N-type semiconductor layer 33 and is connected with the ohmic contact metal layer 40 (as shown in FIG. 1). The at least one auxiliary conductive circuit 42 is respectively connected with the N-type semiconductor layer 33 through an auxiliary ohmic contact metal layer 421. In an embodiment, the at least one auxiliary conductive circuit 42 extends toward the periphery of the vertical light emitting diode structure. As shown in FIG. 6, current density contour lines P1 and P2 are drawn, wherein a value of the current density contour line P1 is greater than a value of the current density contour line P2. That is, the highest current density is located at the center of the N-type semiconductor layer 33 and gradually decreases toward the periphery.

Figure 7:
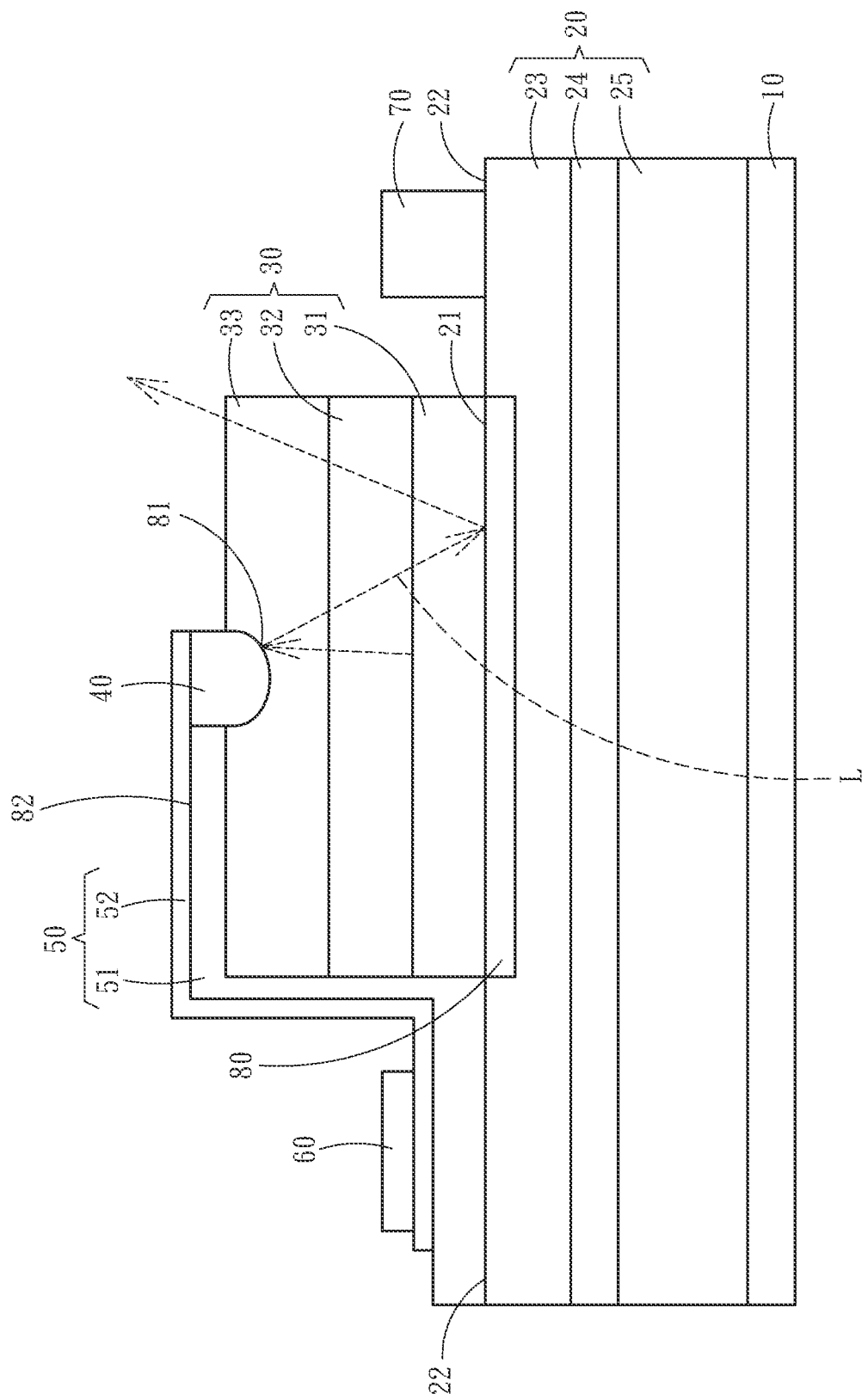
FIG. 7 is a schematic diagram of an excitation light reflection path of one embodiment of the present invention.
Figure 8:
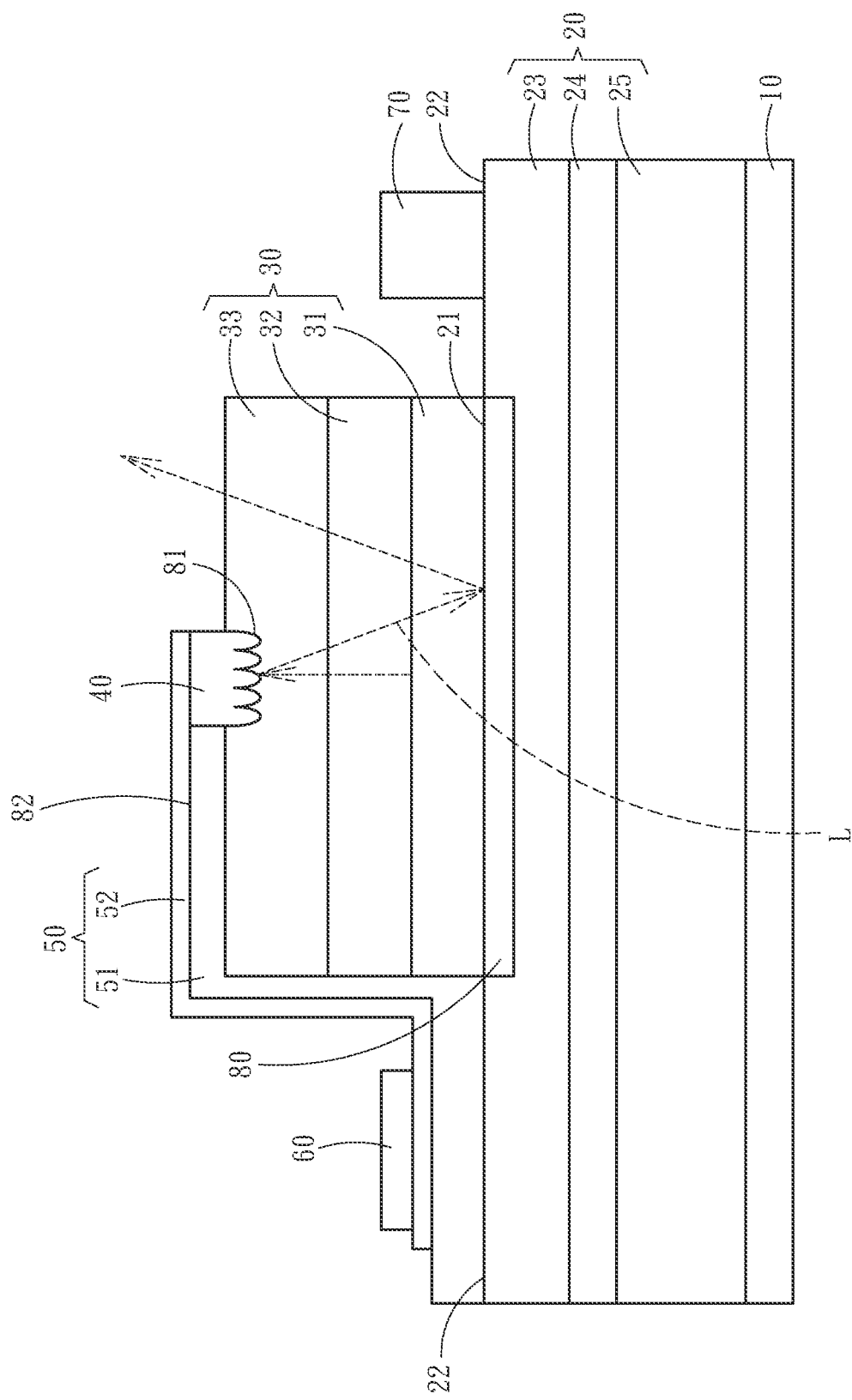
FIG. 8 is a schematic diagram of an excitation light reflection path of another embodiment of the present invention.
Figure 9:
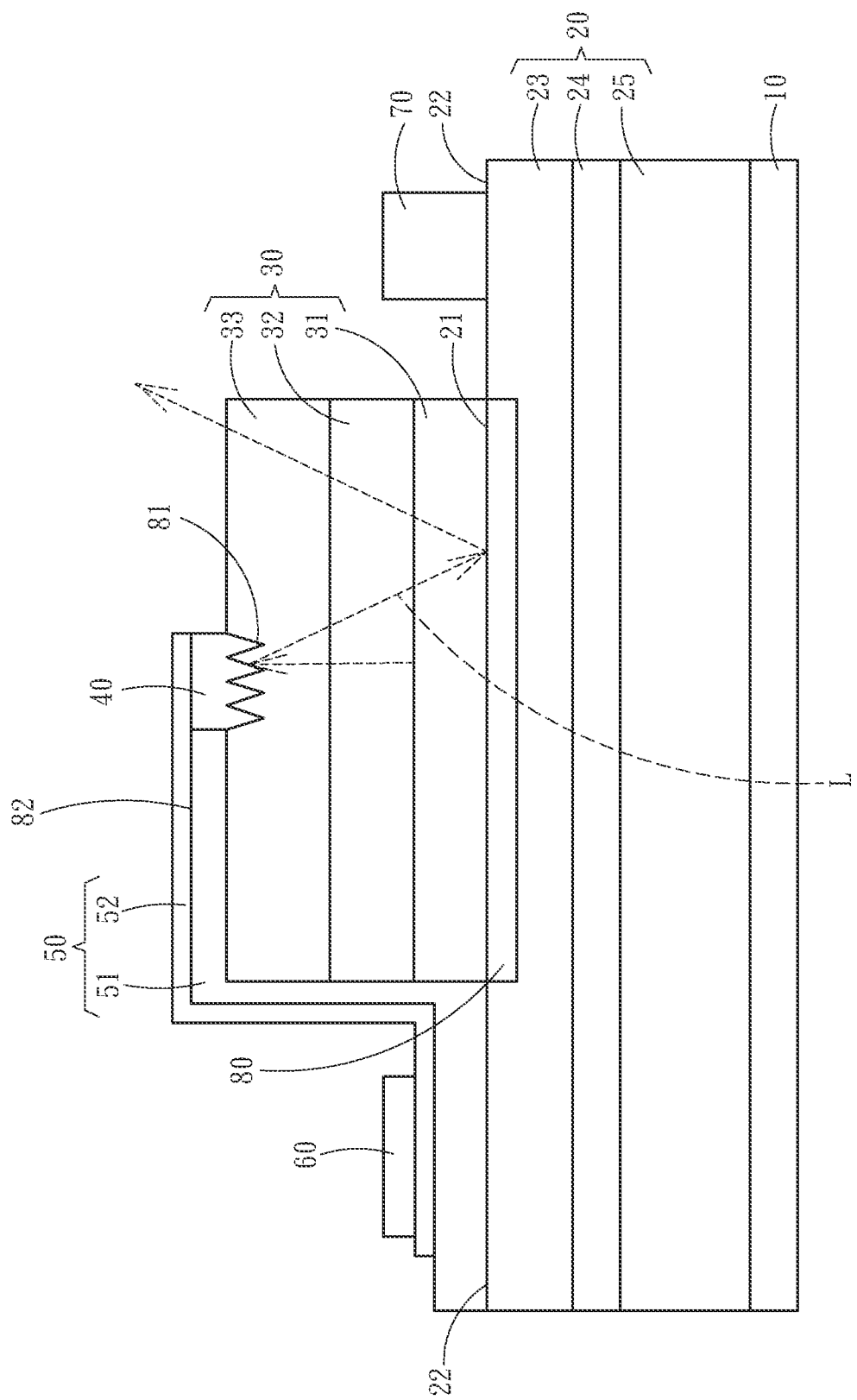
FIG. 9 is a schematic diagram of an excitation light reflection path of another embodiment of the present invention.

With reference to FIG. 7, FIG. 8 and FIG. 9, in one embodiment, in order to increase the brightness, the conductive substrate 20 includes a conductive metal light reflective layer 80 in ohmic contact with the P-type semiconductor layer 31 in a region adjacent to the light emitting semiconductor layer 30. A contact surface between the ohmic contact metal layer 40 and the N-type semiconductor layer 33 is provided with an electrode reflective layer 81 protruding toward the N-type semiconductor layer 33. The electrode reflective layer 81 is configured by the ohmic contact metal layer 40 adopted a highly reflective metal and matched with the N-type semiconductor layer 33 below to form a convex reflective surface. A shape of the electrode reflective layer 81 is selected from a group consisting of a single convex reflector (as shown in FIG. 7), a continuous convex reflector (as shown in FIG. 8), and a multiple micro-tilt reflector (as shown in FIG. 9). Through the arrangement of the conductive metal light reflective layer 80 and the electrode reflective layer 81, an excitation light L generated by the light emitting semiconductor layer 30 would not be shielded by the ohmic contact metal layer 40; and the excitation light L is subjected to multiple reflections by the conductive metal light reflective layer 80 and the electrode reflective layer 81 and emitted from a light emitting surface of the light emitting semiconductor layer 30, thereby increasing the light extraction rate of the excitation light L and improving the luminous brightness. Similarly, the N-type electrode bridging structure 50 can also reduce shading in this way, wherein a contact surface between the bridging conductive layer 52 and the bridging insulating layer 51 is provided with a bridging reflective layer 82 that protrudes toward the bridging insulating layer 51. In detail, in different embodiments, the bridging conductive layer 52 is made of a metal with high reflectivity, and the bridging insulating layer 51 is made of an insulating material with high light transmission (such as $SiO_2$, SiN). Furthermore, in this embodiment, a contact surface between the high light-transmitting insulating layer 51 (transparent) and the bridging conductive layer 52 is made into a downward convex structure by etching. Thus, through the bridging conductive layer 52 as a highly reflective metal, the N-type electrode bridging structure 50 forms a reflector, wherein a shape of the bridging reflective layer 82 is selected from a group consisting of a single convex reflector, a continuous convex reflector and a multiple micro-tilt reflector, whereby the multiple reflections of the conductive metal light reflective layer 80 and the bridging reflective layer 82 are utilized to increase the light extraction rate of the excitation light L.

Figure 10:
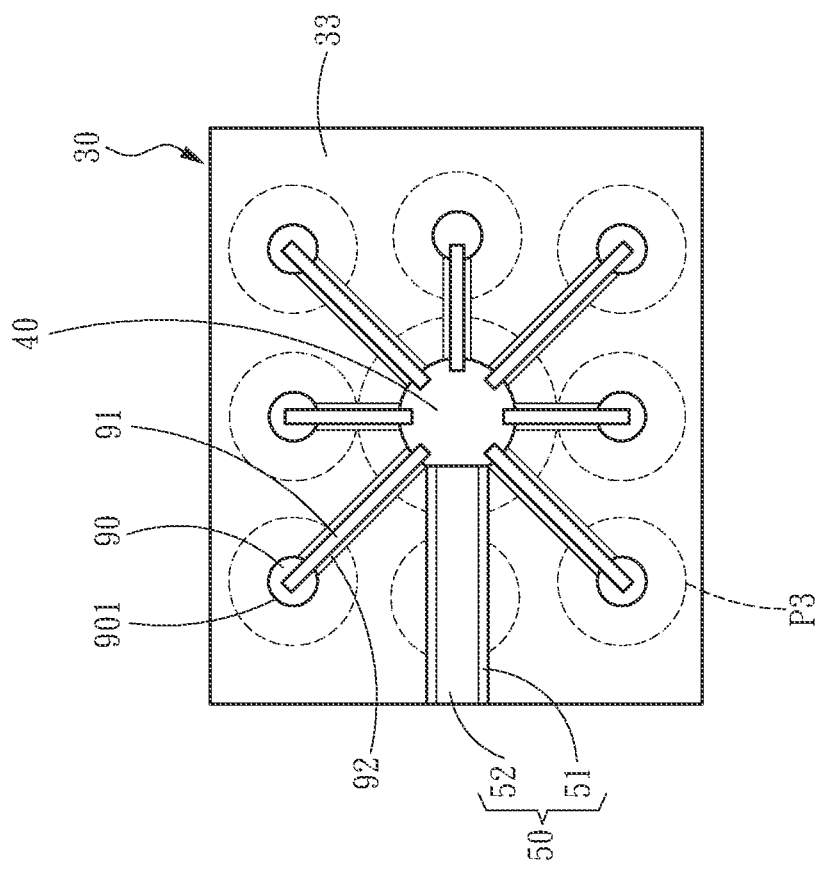
FIG. 10 is a schematic diagram of a top view of a structure of an N-type electrode of a large-size wafer of the present invention.

With reference to FIG. 10, if the light emitting semiconductor layer 30 is a larger size wafer (for example, 3 mm×3 mm), the module expansion concept is taken to configure the circuit. In detail, the vertical light emitting diode structure further includes a plurality of auxiliary N-type electrodes 90. The plurality of auxiliary N-type electrodes 90 are disposed on the N-type semiconductor layer 33 in a dispersed manner and centered on the ohmic contact metal layer 40, and each of the plurality of auxiliary N-type electrodes 90 is respectively connected with the ohmic contact metal layer 40 through an N-type electrode conductive circuit 91 disposed on the N-type semiconductor layer 33. In order to clearly show the connection between the ohmic contact metal layer 40 and the N-type electrode conductive circuit 91, the bridging conductive layer 52 above the ohmic contact metal layer 40 is omitted and not drawn. The plurality of auxiliary N-type electrodes 90 are respectively connected with the N-type semiconductor layer 33 through an auxiliary ohmic contact metal layer 901 respectively. In order to make the working current (not shown in FIG. 10) more dispersed, contact surfaces between the plurality of N-type electrode conductive circuits 91 and the N-type semiconductor layer 33 includes a circuit insulating layer 92. That is, the working current only enters the N-type semiconductor layer 33 from the ohmic contact metal layer 40 and the plurality of auxiliary N-type electrodes 90. It can be seen from the current density contour line P3 of the working current that part of the working current is guided to the periphery, where the plurality of auxiliary N-type electrodes 90 are disposed, of the N-type semiconductor layer 33, can improve the uniformity of light emission.

Figure 11:
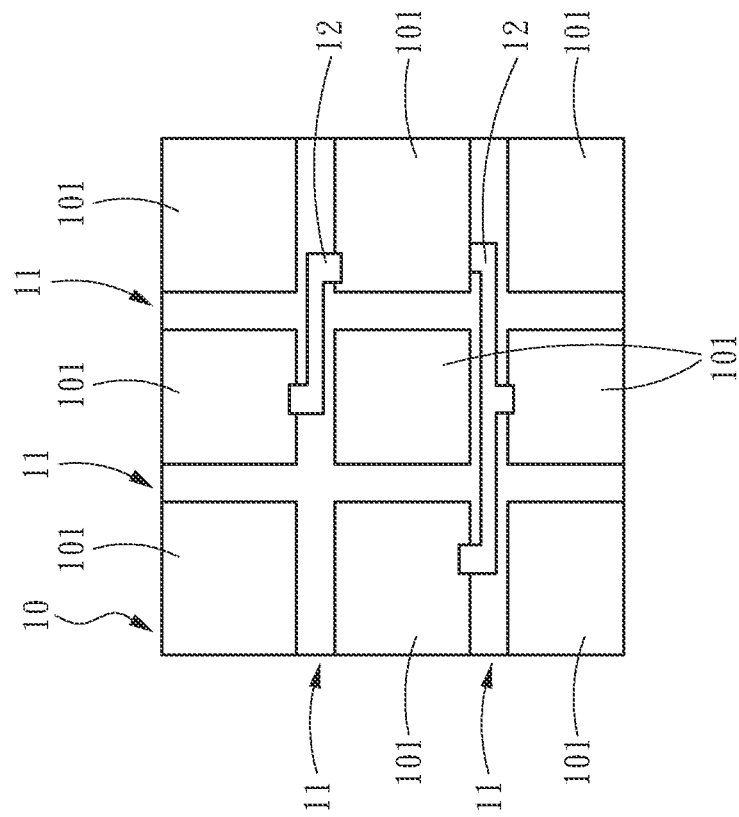
FIG. 11 is a schematic diagram of a bottom view of a structure of a P-type electrode of a large-size wafer of the present invention.

With the reference to FIG. 11, the auxiliary P-type electrode 70 (as shown in FIG. 1) can also be included in an application of the large size wafer. The auxiliary P-type electrode 70 is disposed on the side region 22 of the conductive substrate 20. In order to further disperse the current, the P-type electrode 10 and the conductive substrate 20 (not shown in FIG. 11) are divided by a plurality of insulating isolation channels 11 to achieve an insulating through forming gaps by a semiconductor etching process. The plurality of insulating isolation channels 11 divides the P-type electrode 10 into a plurality of P-type sub-electrodes 101, and positions of the plurality of P-type sub-electrodes 101 correspond to the plurality of auxiliary N-type electrodes 90, respectively. One of the plurality of P-type sub-electrodes 101 is connected with the auxiliary P-type electrode 70 and selectively connected with the other plurality of P-type sub-electrodes 101 through a plurality of P-type conductive circuits 12 disposed on the plurality of insulating isolation channels 11, so that the plurality of P-type sub-electrodes 101 connected with the auxiliary P-type electrode 70 are disposed at intervals. In other words, only parts of the plurality of P-type sub-electrodes 101 are electrically connected with the auxiliary P-type electrode 70. Therefore, if higher current is required in operation and current is forced to be dispersed on P-side, the current can be specified to only pass through the P-type electrode 10 or the auxiliary P-type electrode 70. Through taking the ohmic contact metal layer 40 to generate working current, the current is further forced to be dispersed, the dispersion of heat sources is improved, and the heat dissipation effect is increased.

As mentioned above, the advantages of the present invention include at least the following.

1. The structure design of the vertical light emitting diode has high axial light.

2. The arrangement of the N-type electrode bridging structure allows the N-type electrode to be disposed above the side region, and guides the working current to be dispersed from the center of the N-type semiconductor layer. High current dispersion thereof can help avoiding the interference of the gold wire of the package body caused by the centering of the N-type electrode and the local high current problem caused by the design of the N-type electrode placed on the edge. In addition to improving the luminous efficiency, component reliability is also increased.

3. Through the arrangement of the electrode reflective layer and the bridging reflective layer, together with the conductive metal light reflective layer, the light that is originally shielded can be reflected multiple times and emitted from the light emitting surface to increase the light extraction rate of the excitation light.

4. The light emitting semiconductor layer is not provided under the N-type electrode, and the light emitting semiconductor layer is not subjected to the problem of embrittlement caused by stress damage during a wire bonding process, which can prevent the wire from damaging the N-type semiconductor layer. Meanwhile, the bonding force safety is increased, which is beneficial to good wire bonding and can greatly reduce long-term reliability risks.

5. When the packaging adhesive is pulled in the subsequent packaging process and stress is generated, the metal wire would not be indirectly pulled to cause the risk of cracks or separation of the light emitting semiconductor layer.

6. The dual-electrode design of the P-type electrode and the auxiliary P-type electrode effectively disperses the working current, facilitates higher current operation, and can effectively alleviate the risk of local high heat and component failure when the connection between the P-type electrode and the auxiliary P-type with the package is not smooth or too many pores exist therein.

7. If the light emitting semiconductor layer is a larger size wafer (for example, 3 mm×3 mm), the concept of module expansion can be used. Through the arrangement of the plurality of auxiliary N-type electrodes, the plurality of N-type electrode conductive circuits and the plurality of circuit insulating layers, the working current is guided in a dispersed manner to enter the N-type semiconductor layer from the ohmic contact metal layer and the plurality of auxiliary N-type electrodes, and the working current is effectively dispersed to improve the uniformity of light emission.

8. Compared with the prior art (such as U.S. Pat. No. 8,319,250), the present invention has a relatively simple process, low cost, and has better structural strength, and is more resistant to physical damage. The present invention also increases the dispersion effect of the current of the P-type electrode.

What is claimed is:

1. A vertical light emitting diode structure with high current dispersion and high reliability, comprising:
    a P-type electrode;
    a conductive substrate, provided, on one side, with the P-type electrode, and, on the other side, with a central region and a side region adjacent to the central region;
    a light emitting semiconductor layer, disposed on the central region of the conductive substrate and comprising a P-type semiconductor layer disposed on the conductive substrate, a multiple-quantum well layer disposed on the P-type semiconductor layer and an N-type semiconductor layer disposed on the multiple-quantum well layer;
    an ohmic contact metal layer, disposed at a center of the N-type semiconductor layer, and in ohmic contact with the N-type semiconductor layer;
    an N-type electrode bridging structure, comprising a bridging insulating layer and a bridging conductive layer, the bridging insulating layer disposed to cross over the N-type semiconductor layer and the side region of the conductive substrate, the bridging insulating layer in contact with the ohmic contact metal layer, the bridging conductive layer disposed on the bridging insulating layer, one end of the bridging conductive layer connected with the ohmic contact metal layer, and the other end of the bridging conductive layer extending to the side region of the conductive substrate; and
    an N-type electrode, disposed on the bridging conductive layer and positioned above the side region.

2. The vertical light emitting diode structure according to claim 1, further comprising an auxiliary P-type electrode disposed on the side region of the conductive substrate.

3. The vertical light emitting diode structure according to claim 2, wherein the side region surrounds the central region, and the auxiliary P-type electrode and the N-type electrode are located on the side region and located on a same side of the central region.

4. The vertical light emitting diode structure according to claim 2, wherein the side region surrounds the central region, and the auxiliary P-type electrode and the N-type electrode are located on the side region and respectively located on different sides of the central region.

5. The vertical light emitting diode structure according to claim 2, wherein any one of the P-type electrode and the auxiliary P-type electrode is selected as a first electrode, the N-type electrode is adopted as a second electrode, and a working voltage is supplied between the first electrode and the second electrode.

6. The vertical light emitting diode structure according to claim 2, wherein the P-type electrode and the auxiliary P-type electrode are both adopted as a first electrode, the N-type electrode is adopted as a second electrode, and a working voltage is supplied between the first electrode and the second electrode.

7. The vertical light emitting diode structure according to claim 1, further comprising at least one auxiliary conductive circuit disposed on the N-type semiconductor layer and connected with the ohmic contact metal layer, and the at least one auxiliary conductive circuit connected with the N-type semiconductor layer through an auxiliary ohmic contact metal layer, respectively.

8. The vertical light emitting diode structure according to claim 7, wherein the at least one auxiliary conductive circuit extends toward a periphery.

9. The vertical light emitting diode structure according to claim 1, wherein the conductive substrate comprises a conductive metal light reflective layer in a region adjacent to the light emitting semiconductor layer.

10. The vertical light emitting diode structure according to claim 9, wherein a contact surface between the ohmic contact metal layer and the N-type semiconductor layer comprises an electrode reflective layer protruding toward the N-type semiconductor layer.

11. The vertical light emitting diode structure according to claim 10, wherein a shape of the electrode reflective layer is selected from a group consisting of a single convex reflector, a continuous convex reflector, and a multiple micro-tilt reflector.

12. The vertical light emitting diode structure according to claim 9, wherein a contact surface between the bridging conductive layer and the bridging insulating layer comprises a bridging reflective layer protruding toward the bridging insulating layer.

13. The vertical light emitting diode structure according to claim 12, wherein a shape of the bridging reflective layer is selected from a group consisting of a single convex reflector, a continuous convex reflector, and a multiple micro-tilt reflector.

14. The vertical light emitting diode structure according to claim 1, further comprising a plurality of auxiliary N-type electrodes disposed on the N-type semiconductor layer in a dispersed manner and centered on the ohmic contact metal layer, each of the plurality of auxiliary N-type electrodes respectively connected with the ohmic contact metal layer by an N-type electrode conductive circuit disposed on the N-type semiconductor layer, contact surfaces between the plurality of N-type electrode conductive circuits and the N-type semiconductor layer respectively comprising a circuit insulating layer, the plurality of auxiliary N-type electrodes respectively connected with the N-type semiconductor layer through an auxiliary ohmic contact metal layer.

15. The vertical light emitting diode structure according to claim 14, further comprising an auxiliary P-type electrode disposed on the side region of the conductive substrate.

16. The vertical light emitting diode structure according to claim 15, wherein the P-type electrode and the conductive substrate are divided by a plurality of insulating isolation channels to divide the P-type electrode into a plurality of P-type sub-electrodes and to position the plurality of P-type sub-electrodes respectively correspond to the plurality of auxiliary N-type electrodes, wherein one of the plurality of P-type sub-electrodes is connected with the auxiliary P-type electrode and selectively connected with the plurality of P-type sub-electrodes through a plurality of P-type conductive circuits disposed on the plurality of insulating isolation channels, and wherein the plurality of P-type sub-electrodes connected with the auxiliary P-type electrode are disposed at intervals.

17. The vertical light emitting diode structure according to claim 1, wherein the conductive substrate comprises a buffer layer, a bonding layer and a substitute substrate, the bridging insulating layer and the light emitting semiconductor layer are disposed on the buffer layer, the substitute substrate is disposed at the P-type electrode, and the bonding layer bonds and fixes the buffer layer and the substitute substrate.

* * * * *